(12) United States Patent
Sato

(10) Patent No.: US 8,228,585 B2
(45) Date of Patent: Jul. 24, 2012

(54) SUBSTRATE FOR ELECTRO-OPTICAL DEVICES, ELECTRO-OPTICAL DEVICE AND ELECTRONIC APPARATUS

(75) Inventor: Takashi Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 25 days.

(21) Appl. No.: 13/013,372

(22) Filed: Jan. 25, 2011

(65) Prior Publication Data

US 2011/0188111 A1 Aug. 4, 2011

(30) Foreign Application Priority Data

Feb. 4, 2010 (JP) .................................. 2010-023306

(51) Int. Cl.
*G02F 1/03* (2006.01)
(52) U.S. Cl. ........................................ 359/245; 359/290
(58) Field of Classification Search .................... 359/245
See application file for complete search history.

(56) References Cited

U.S. PATENT DOCUMENTS

| 2005/0082541 A1 | 4/2005 | Satou |
| 2007/0290209 A1* | 12/2007 | Fujino et al. ..................... 257/72 |
| 2009/0014716 A1 | 1/2009 | Yamaga et al. |

FOREIGN PATENT DOCUMENTS

| JP | 3261699 B | 3/2002 |
| JP | 2009-038337 A | 2/2009 |
| WO | WO-97-13177 A | 4/1997 |

* cited by examiner

*Primary Examiner* — James Jones
(74) *Attorney, Agent, or Firm* — AdvantEdge Law Group, LLC

(57) ABSTRACT

A electro-optical device is provide with a substrate, a pixel electrode provide for each pixel, a pixel transistor which is provided for each pixel more to a lower layer side through an interlayer insulating film than the pixel electrode and is connected to the pixel electrode, a periphery transistor provided in a periphery region, and a connection wire formed in the same film as the pixel electrode in a region where the interlayer insulating film and a gate insulating film included in the pixel transistor and the periphery transistor are not formed, and electrically connected to the periphery transistor.

15 Claims, 10 Drawing Sheets

SUBSTRATE FOR ELECTRO-OPTICAL DEVICES, ELECTRO-OPTICAL DEVICE AND ELECTRONIC APPARATUS

CROSS-REFERENCE TO RELATED APPLICATION

This application is based on and claims priority from Japanese Patent Application No. 2010-023306, filed on Feb. 4, 2010, the contents of which are incorporated herein by reference.

BACKGROUND

1. Technical Field

The present invention relates to a substrate for electro-optical devices, an electro-optical device provided with the substrate for electro-optical devices, and an electronic apparatus provided with the electro-optical device.

2. Related Art

As an example of this type of a substrate for electro-optical devices, for example, there is an active matrix substrate which is used in an electro-optical device such as an electrophoretic display device of an active matrix driving method, and is provided with a pixel electrode and scanning lines, data lines, and a thin film transistor (TFT) acting as pixel switching elements for performing selective driving of the pixel electrode, on the substrate. The above constituent elements are formed in a laminated structure on the substrate. Each of the constituent elements is arranged so that each layer is separated and isolated by interlayer insulating films, and are appropriately electrically connected via contact holes (also called "through holes") formed in the interlayer insulating films.

Also, the substrate used in this type of electro-optical device is changing from glass substrates which have low flexibility (in other words, rigid) used in the past to plastic substrates which are light and have superior flexibility. As a result, there is demand for a substrate for electro-optical devices provided with a TFT corresponding to the flexibility of the substrate.

For example, in JP-A-2009-38337, a technology is disclosed for manufacturing organic thin film transistors by applying a material in a limited manner to a region for film deposition using a printing method. According to such a technology, an etching process for forming contact holes can be reduced.

However, in JP-A-2009-38337 described above, as a gate insulating film is formed over the entire surface of the substrate, problems such as those below occur. A first problem is that the substrate is bent by stress in a film when using a plastic substrate due to the gate insulating film being formed on the entire surface of the substrate. A second problem is that, as the gate insulating film is present over the entire surface of the substrate, a process is necessary for opening contact holes in the gate insulating film for connecting the gate electrode and an external electrode or for forming a circuit such as a protection diode on the substrate, and thus, the manufacturing process becomes complicated. A third problem is that, as the gate insulating film is formed over the entire surface of the substrate, this goes against demands for saving resources and lower costs.

It is known that if there is large stress in the substrate, not only is the shape of a final product deformed but transportation is not possible when there is bending of the substrate during processing, and in extreme cases, the substrate becomes a roll shape and treatment in later processes cannot be performed. Furthermore, it is also known that as stress increases as the film forming is repeated, the problem increases in the later processes. These problems become further pronounced when using the plastic substrate as described above.

SUMMARY

An advantage of some aspects of the invention is that a substrate for electro-optical devices, which can suppress bending of the substrate while accommodating demands for saving resources and lower costs, an electro-optical device, and an electronic apparatus can be provided.

According to an aspect of the invention, there is provided a substrate for electro-optical devices, which has a display region where a plurality of pixels is arranged, including a substrate, a pixel electrode provided for each of the pixels on the substrate, a pixel transistor which is provided for each of the pixels on the substrate more to a lower layer side than the pixel electrode, includes a gate insulating film selectively provided in a specific region on the substrate, and is electrically connected to the pixel electrode, an interlayer insulating film arranged between the pixel electrode and the pixel transistor and selectively provided in a specific region on the substrate, a periphery transistor provided in a peripheral region positioned on the periphery of the display region on the substrate, and a connection wire formed in the same film as the pixel electrode in a region where the interlayer insulating film and the gate insulating film configuring the pixel transistor and the periphery transistor are not formed and electrically connected to the periphery transistor.

According to the substrate for electro-optical devices of an aspect of the invention, in the display region (also referred to as a pixel region or an image display region as appropriate) where the plurality of pixels is arranged in, for example, a matrix shape, it is possible to realize an image display using a so-called active matrix method by applying image signals to the pixel electrode provided for each pixel.

The "pixel transistor" of an aspect of the invention is provided for each pixel and are electrically connected to the pixel electrode. The pixel transistor is, for example, arranged in the display region where the plurality of pixels is arranged in a matrix shape and makes possible an image display using, for example, a so-called active matrix method by functioning as a switching element for each of the pixels. That is, the application timing of the image signals to the pixel electrode is controlled by the pixel transistor electrically connected to the pixel electrode turning on or off at specific timings. The pixel electrode is, for example, a transmissive electrode formed from a transmissive and conductive material such as ITO (Indium Tin Oxide) or a non-transmissive electrode formed from metals or the like.

Also, the pixel transistor is formed more to the lower layer side than the pixel electrode. In other words, the interlayer insulating film is interposed between the pixel transistor and the pixel electrode, and by the pixel transistor and the pixel electrode being electrically connected to each other via, for example, the contact hole opened in the interlayer insulating film, the image signal is supplied to the pixel electrode by the pixel transistor while being controlled to be on or off. Here, the contact hole for electrically connecting the pixel transistor and the pixel electrode may be formed by applying an insulating material in the regions excluding the regions where the contact hole will be formed.

The pixel transistor includes the gate insulating film selectively provided in a specific region on the substrate. Here, "selectively provided in a specific region on the substrate" has the meaning of being provided only in a specific region on the substrate, or in other words, provided only on a region of one part of the substrate. For example, the gate insulating film is formed by applying an insulating material in an appropriate region on the substrate using an application method such as an ink jet method. The gate insulating film selectively provided in this manner does not generate wasted materials in the formation process thereof compared to the case where it is formed by laminating an insulating material over the entire surface of the substrate and then performing patterning. As a result, demands for saving resources and lower costs can be accommodated. Also, as the gate insulating film is not formed over the entire surface of the substrate, stress in the substrate can be suppressed.

The "interlayer insulating film" of the an aspect of invention is arranged between the pixel electrode and the pixel transistor and is selectively provided in a specific region on the substrate. In the same manner as the gate insulating film described above, the interlayer insulating film is also selectively provided. As a result, also in regard to the interlayer insulating film, demands for saving resources and lower costs can be accommodated and stress in the substrate can be suppressed.

The "periphery transistor" of the an aspect of invention, is formed in a peripheral region. Here, the peripheral region is a region positioned on the periphery of the display region on the substrate. The periphery transistor is used as a circuit element for configuring a driver circuit (that is, an X driver circuit and a Y driver circuit) performing, for example, a relatively rapid switching operation of a driving method with a high driving frequency, a current amplifying operation or a current controlling operation, a rectifying operation, a voltage holding operation and the like. Here, as the purpose of the periphery transistor, there is no limitation so long as it is engaged in the electro-optical operation of the electro-optical device.

Here, in the pixel transistor and the periphery transistor, the gate electrode may be a top gate type arranged more to the upper layer side than the semiconductor layer in the laminate structure on the substrate, the gate electrode may be a bottom gate type arranged more to the lower layer side than the semiconductor layer in the laminate structure on the substrate, or the gate electrode may be a double gate type arranged on both of the upper layer side and the lower layer side of the semiconductor layer.

The "connection wire" of the an aspect of invention are formed in a region where the interlayer insulating film and the gate insulating film included in the pixel transistor and the periphery transistor are not formed. The connection wire is a wire to electrically connect the periphery transistor with other conductive layers, for example, various wires, elements or the like for realizing an electro-optical operation which are formed on the substrate. The connection wire is formed using a conductive material such as aluminum or the like. The region where the connection wire is formed is in a state where various wires, elements or the like, which are the connection target of the connection wire, are partially exposed by not forming the gate insulating layer and the interlayer insulating layer. The connection wire performs electrical connection with the connection target by being formed on the connection target which is partially exposed in this manner. That is, the connection wire realizes electrical connection not via the contact hole but by being formed to come into direct contact with the connection target (namely, there is no laminating structure between it and the connection target). As connection in this manner does not require performing of a process of making openings in the gate insulating film or the interlayer insulating film by etching or the like, electrical connection can be realized by fewer processes compared to the case of electrical connection via the contact holes. Also, in the an aspect of invention, when electrically connecting the connection wire to the connection target, as it is not necessary to form the insulating film over the entire surface of the substrate as in the case of forming a contact hole, it is possible to effectively suppress bending (that is, structural warping) of the completed substrate for electro-optical devices.

The "connection wire" of the an aspect of invention are formed in the same film as the pixel electrode. Here, the "same film" has the meaning of a film formed by the same film deposition process and does not only mean that the pixel electrode and the connection wire are completely the same film. The pixel electrode and the connection wire may not be electrically connected to each other and various conditions such as thickness may be different. The connection wire and the pixel electrode may be formed by the same conductive film being simultaneously patterned or may be simultaneously formed by an application method. In the case of the application method, the connection wire is selectively formed in the region where it is to be formed. In particular, as it is substantially the final process in the TFT manufacturing process, the pixel electrode is performed in a state where stress has accumulated. As a result, formation using the application method, where a material is not formed in a film over the entire surface, is preferable. By forming the connection wire from the same film as the pixel electrode electrically connected to the pixel transistor, the pixel electrode and the connection wire can be formed in the same process. Accordingly, the number of processes can be reduced and manufacturing costs can be reduced.

As described above, according to the an aspect of invention, it is possible to realize the substrate for electro-optical devices capable of accommodating demands for saving resources and lowering costs while suppressing bending of the substrate.

In an aspect of the substrate for electro-optical devices of the invention, it is desirable if the gate insulating film and the interlayer insulating film are formed by selectively applying an insulating material to a region where the gate insulating film and the interlayer insulating film are to be formed.

According to an aspect, the gate insulating film and the interlayer insulating film are formed by applying an insulating material to an appropriate region on the substrate using an application method such as an ink jet method and the like. Here, "selectively apply" has the meaning of being provided only in a specific region on the substrate, or in other words, being provided only in a partial region on the substrate. In this manner, the gate insulating film and the interlayer insulating film are not formed by forming a single film over the entire surface of the substrate and performing patterning but are formed by selectively applying a material. Thus, wasted materials are not generated in the formation process. That is, it is possible to realize the substrate for electro-optical devices further accommodating demands for saving resources and lowering costs. Furthermore, it is also possible to reduce processes since an etching process is not used. Also, since the gate insulating film and the interlayer insulating film can be formed without forming a film of an insulating material over the entire surface of the substrate, stress in the substrate can be suppressed. In particular, since there is a tendency for the film thickness of the interlayer insulating layer to become thick, by forming the interlayer insulating film by selective application, stress can be effectively reduced.

In another aspect of the substrate for electro-optical devices of the invention, it is desirable if the pixel electrode and the connection wire are formed by selectively applying a conductive material in a region where the pixel electrode and the connection wire are to be formed.

According to another aspect, in a similar manner to the gate insulating film and the interlayer insulating film described above, also in regard to the pixel electrode and the connection wire formed as a conductive layer, due to being formed by selectively applying a material, it is possible to realize the substrate for electro-optical devices capable of accommodating demands for saving resources and lower costs while suppressing bending of the substrate.

In another aspect of the substrate for electro-optical devices of the invention, it is desirable if the connection wire is formed to be diode-connected with the periphery transistor described above.

According to another aspect, for example, by forming the connection wire so as to electrically connect between the gate and the source of the periphery transistor, a diode circuit can be formed in the peripheral region using the periphery transistor.

In another aspect of the substrate for electro-optical devices of the invention, it is desirable if a plurality of the periphery transistors is provided, and by being connected to each other by the connection wire, the plurality of periphery transistors configures an inverter circuit.

According to another aspect, for example, using the plurality of periphery transistors, a periphery circuit such as a static electricity protection circuit and the like can be formed.

In order to solve the problems described above, the electro-optical device of an aspect of the invention is provided with the substrate for electro-optical devices of the invention described above (each aspect is included).

According to the electro-optical device of an aspect of the invention, since it is provided with the substrate for electro-optical devices of the invention described above, it is possible to realize various display devices which can perform high quality display, such as an electrophoretic display device, a liquid crystal display device, an organic EL (electro-luminescence) display device.

In order to solve the problems described above, the electronic apparatus of an aspect of the invention is provided with the electro-optical device of the invention described above (each aspect is included).

According to the electronic apparatus of an aspect of the invention, since it is provided with the electro-optical device of the invention described above, it is possible to realize an electrophoresis device such as electronic paper, an electron emission device (a field emission display and a conduction electron-emitter display), DLP (digital light processing) as a device using the electrophoresis device and the electron emission device, and the like, which can perform high-quality image display. Also, as the electronic apparatus of the invention, it is also possible to realize various electronic apparatuses such as a projection-type display device, a television, a mobile phone, an electronic notebook, a word processor, a video tape recorder of a view finder type or a monitor direct viewing type, a work station, a TV phone, a POS terminal, a touch panel, a sensor formed in a surface of artificial skin, and the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, the embodiments of the invention will be described while referring to the diagrams. In the embodiments below, an electrophoretic display panel of a TFT active matrix driving method, which is an example of an electro-optical device provided with an active matrix substrate which is an example of the substrate for electro-optical devices of the invention, is used as an example.

Electrophoretic Display Panel

First Embodiment

First, an entire configuration of an electrophoretic display panel of the present embodiment will be described with reference to FIGS. 1 and 2.

Figure 1:
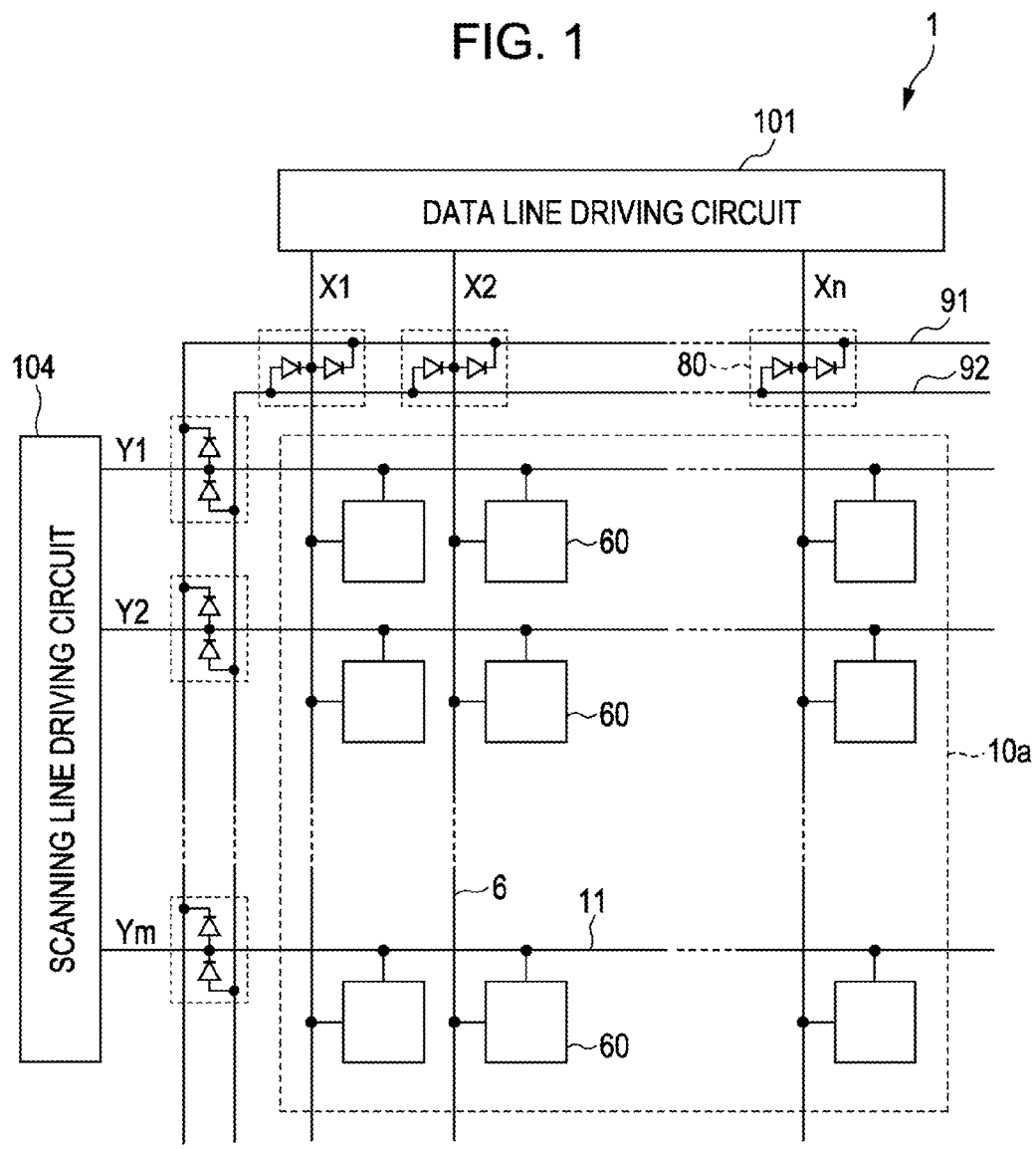
FIG. 1 is a block diagram illustrating an entire configuration of an electrophoretic display panel according to a first embodiment.

FIG. 1 is a block diagram illustrating an entire configuration of the electrophoretic display panel of the embodiment. Hereinbelow, unless otherwise mentioned, a TFT is an n channel type.

In FIG. 1, an electrophoretic display panel 1 of the embodiment has an image display region 10a where m rows and n columns of pixels 60 are arranged in a matrix (two dimensional planar) shape. In the image display region 10a, m scanning lines 11 (that is, scanning lines Y1, Y2, ..., Ym) and n data lines 6 (that is, data lines X1, X2, ..., Xn) are provided to intersect with each other. The m scanning lines 11 extend in a row direction (that is, an X direction) and the n data lines 6 extend in a column direction (that is, a Y direction). The pixels 60 are arranged to correspond to the intersections of the m scanning lines 11 and the n data lines 6.

The electrophoretic display panel 1 is provided with a scanning line driving circuit 104 and a data line driving circuit 101 for supplying scanning signals and image signals which are required to drive the pixels 60.

The scanning line driving circuit 104 sequentially supplies scanning signals in pulses to each of the scanning lines Y1, Y2, ..., Ym. On the other hand, the data line driving circuit 101 supplies image signals to the data lines X1, X2, ..., Xn so as to synchronize with the supply timing of the scanning signals from the scanning line driving circuit 104. The image signals take on levels of 2 values, a high potential level (referred to below as "high level". For example, 15V) or a low potential level (referred to below as "low level". For example, −15V). As an example of another voltage, the scanning lines 11 may apply 25V as a selection voltage, −10V as a non-selection voltage, and 0V to an opposing electrode 21.

Here, in the embodiment, a configuration is adopted where the scanning line driving circuit 104 and the data line driving circuit 101 are built into the electrophoretic display panel 1, but they may be provided externally as an externally attached IC such as a COF (chip on film).

The scanning lines 11 and the data lines 6 are electrically connected to a static electricity protection circuit 80 in a peripheral region positioned in a periphery of the image display region 10a. The static electricity protection circuit 80 prevents high voltage pulses (so-called ESD surges) from entering a circuit. Specifically, the static electricity protection circuit 80, for example, channels an ESD surge which has entered an internal portion of a circuit to a high potential voltage source line 91 and a low potential voltage source line 92. As a result, the flowing of the ESD surge into the internal portion of the circuit can be avoided. Here, a specific configuration of the static electricity protection circuit 80 will be described in detail later.

A voltage source circuit (not shown) supplies a high potential voltage source potential Vdd to the high potential voltage source line 91 and supplies a low potential voltage source potential Vss to the low potential voltage source line 92.

Figure 2:
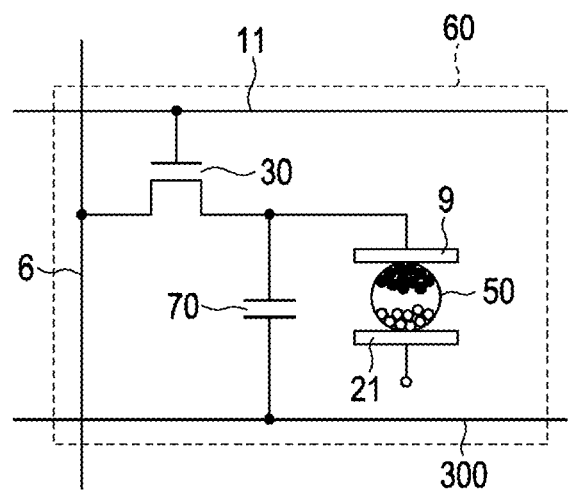
FIG. 2 is a circuit diagram of a pixel in an image display region of the electrophoretic display panel according to the embodiment.

FIG. 2 is a circuit diagram of one of the pixels 60 in the image display region 10a of the electrophoretic display panel 1 of the embodiment.

In FIG. 2, the pixel 60 is configured so as to be able to perform grayscale display using an electrophoresis element 50 interposed between a pixel electrode 9 and the opposing electrode 21 which are each formed on a surface of a pair of substrates (that is, an element substrate and an opposing substrate to be described later) arranged so as to face each other.

Here, the electrophoresis element 50 is configured from a plurality of microcapsules which each include an electrophoresis particle. The microcapsules have enclosed, for example, a dispersion medium inside of the capsule, a plurality of white particles and a plurality of black particles. The capsule functions as the outer shell of the microcapsule and is formed from an acrylic resin such as polymethyl methacrylate or polyethyl methacrylate, or a transparent polymer resin such as urea resin or gum Arabic. The dispersion medium is a medium dispersing the white particles and the black particles in the microcapsules (in other words, in the capsule) and water, alcohol based solvents such as methanol, ethanol, iso-propanol, butanol, octanol, or methyl cellosolve, various types of esters such as ethyl acetate or butyl acetate, ketones such as acetone, methyl ethyl ketone or methyl isobutyl ketone, aliphatic hydrocarbons such as pentane, hexane, or octane, alicyclic hydrocarbons such as cyclohexane or methylcyclohexane, aromatic hydrocarbons such as benzene, toluene, xylene or benzenes with a long-chain alkyl group such as hexyl benzene, heptyl benzene, octyl benzene, nonyl benzene, decyl benzene, undecyl benzene, dodecyl benzene, tridecyl benzene or tetradecyl benzene, halogenated hydrocarbons such as methylene chloride, chloroform, carbon tetrachloride or 1,2-dichloroethane, carboxylate or other oils, can be used singularly or in combination. Also, in the dispersion medium, a surfactant may be included. The white particles are particles (polymer or colloid) consisting of a white pigment such as titanium dioxide, zinc oxide or antimony trioxide, and for example, are negatively charged. The black particles are particles (polymer or colloid) of a black pigment such as aniline black or carbon black, and for example, are positively charged. As a result, the white particles and the black particles can be moved within the dispersion medium using an electrical field generated by a difference in potential between the pixel electrode 9 and the opposing electrode 21.

Here, in these pigments, electrolytes, surfactants, metallic soaps, resins, rubber, oils, varnishes, charge control agents formed from particles such as compounds, dispersants such as titanium-based coupling agents, aluminum-based coupling agents and silane-based coupling agents, lubricants, stabilizers and the like can be added as required.

Each of the pixels 60 is provided with a TFT 30 for pixel switching and a holding capacitor 70.

The gate of the TFT 30 is electrically connected to the scanning lines 11, the source of the TFT 30 is electrically connected to the data lines 6, and the drain of the TFT 30 is connected to the pixel electrodes 9. The TFT 30 outputs the image signals supplied from the data line driving circuit 101 (refer to FIG. 1) via the data lines 6 to the pixel electrode 9 at a timing corresponding to the scanning signals supplied in pulses from the scanning lines driving circuit 104 (refer to FIG. 1) via the scanning lines 11.

The holding capacitor 70 is configured by interposing a capacitance insulating film between a pair of electrodes. Here, one of the electrodes of the pair of electrodes (specifically, a relay layer 8 to be described later) is electrically connected to the drain of the TFT 30 and the pixel electrode 9, and the other electrode (specifically, a capacitance electrode 71 to be described later) is electrically connected to a common potential line 300 which holds a specific potential. Here, the potential of the common potential line 300 may be a constant value or may vary over a constant or arbitrary cycle, and a voltage is supplied from a voltage source circuit (not shown). In this manner, by providing a holding capacitor 70 in parallel to the pixels 60, the holding characteristics of the image signals of the pixel electrodes 9 can be improved. Here, in the case where the holding characteristics of the pixels can be sufficiently secured without the holding capacitor 70, the holding capacitor 70 may not be provided.

Figure 3:
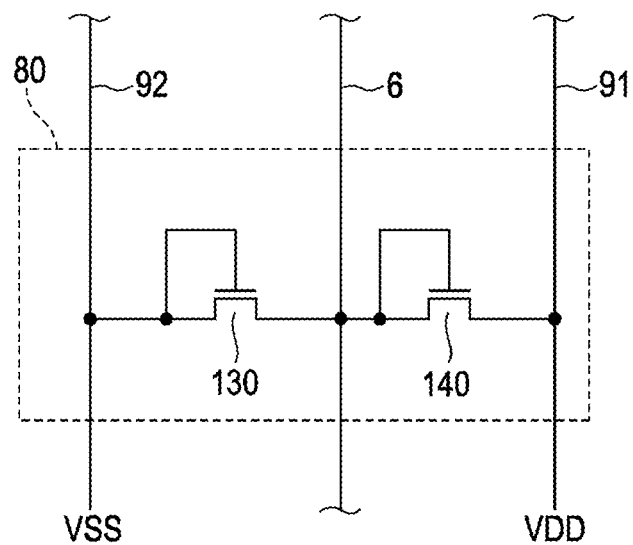
FIG. 3 is a block diagram illustrating an electrical configuration of a static electricity protection circuit provided in the electrophoretic display panel according to the first embodiment.

Next, the specific configuration of the static electricity protection circuit 80 formed in the peripheral region will be described with reference to FIG. 3. FIG. 3 is a block diagram illustrating an electrical configuration of the static electricity protection circuit 80 provided in the electrophoretic display panel 1 of the embodiment.

The static electricity protection circuit 80 is configured by being provided with a first transistor 130 and a second transistor 140 which are diode-connected.

The source of the first transistor 130 is electrically connected to the data line 6, and the gate and the drain of the first transistor 130 electrically short-circuit each other. The gate and the drain of the first transistor 130 are held at the potential Vss by being electrically connected to the low potential voltage source line 92, and the source of the first transistor 130 is electrically connected to the data line 6. On the other hand, the source of the second transistor 140 is electrically connected to the high potential voltage source line 91 and is held at the potential Vdd, and the gate and the drain of the second transistor 140 electrically short-circuit each other and are electrically connected to the data line 6. By biasing the first transistor 130 and the second transistor 140, which are diode-connected in this manner, in a reverse direction, current leakage can be suppressed when static electricity is not generated. In addition, in the case when electrostatic discharge (ESD) generates an ESD surge which is applied to the data line 6 and the potential thereof exceeds that of the two voltage source lines 91 and 92, the ESD surge can be swiftly discharged to the two voltage source lines 91 and 92 via the first transistor 130 and the second transistor 140. Accordingly, the static electricity protection circuit 80 can prevent static electricity breakage of the internal circuits (for example, the circuit elements of the TFT and the like of the image display region 10a and the data lines driving circuit 101 in the peripheral region) due to the ESD surge being applied to the data line 6. Here, also the static electricity protection circuit 80 electrically connected to the scanning line 11 in the same manner as the static electricity protection circuit 80 electrically connected to the data line 6 described above can prevent static electricity breakage of the internal circuits (for example, the circuit elements of the TFT and the like of the image display region 10a and the scanning lines driving circuit 104 in the peripheral region) due to the ESD surge being applied to the scanning line 11.

Figure 4:
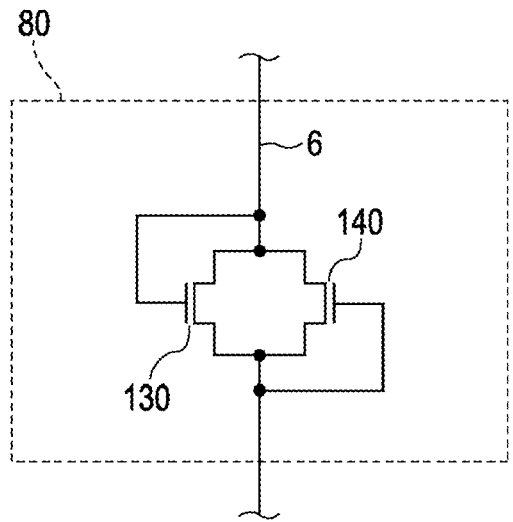
FIG. 4 is a block diagram illustrating another example of an electrical configuration of a static electricity protection circuit provided in the electrophoretic display panel according to the first embodiment.

Here, the static electricity protection circuit 80 may have the circuit configuration shown in FIG. 4. FIG. 4 is a block diagram illustrating another example of an electrical configuration of the static electricity protection circuit 80 provided in the electrophoretic display panel 1 of the embodiment. The static electricity protection circuit 80 of FIG. 4 has two connection terminals, one of the connection terminals is connected to the data line 6 or the scanning line 11 and the other connection terminal is connected to a common line (not shown). For example, in the configuration of FIGS. 1 and 3, the high potential voltage source line 91 is the common line, and the circuit of FIG. 4 is used instead of a diode 140. In this case, the low potential voltage source line 92 may not be used. In the common line, a common potential, for example 0V, is applied.

Next, the specific configuration of the image display region 10a of the electrophoretic display panel 1 of the embodiment will be described with reference to FIGS. 5 and 6.

Figure 5:
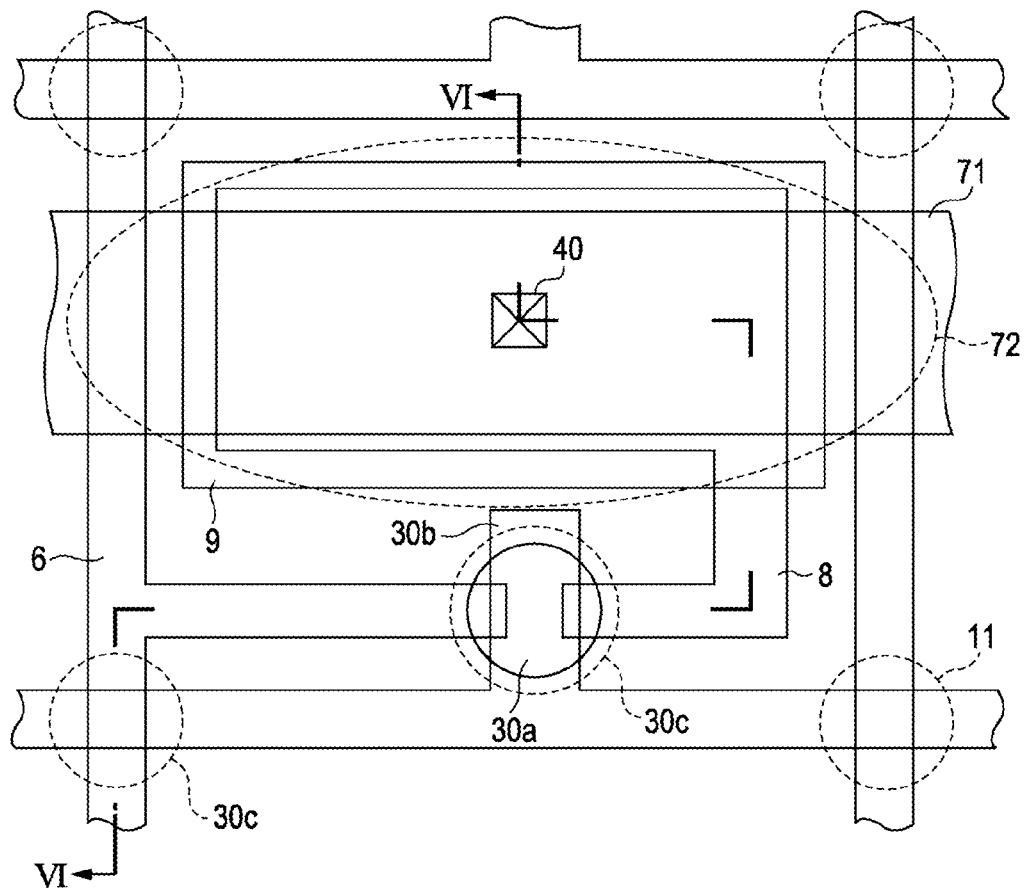
FIG. 5 is an enlarged planar diagram of a pixel of an image display region of the electrophoretic display panel according to the first embodiment.
Figure 6:
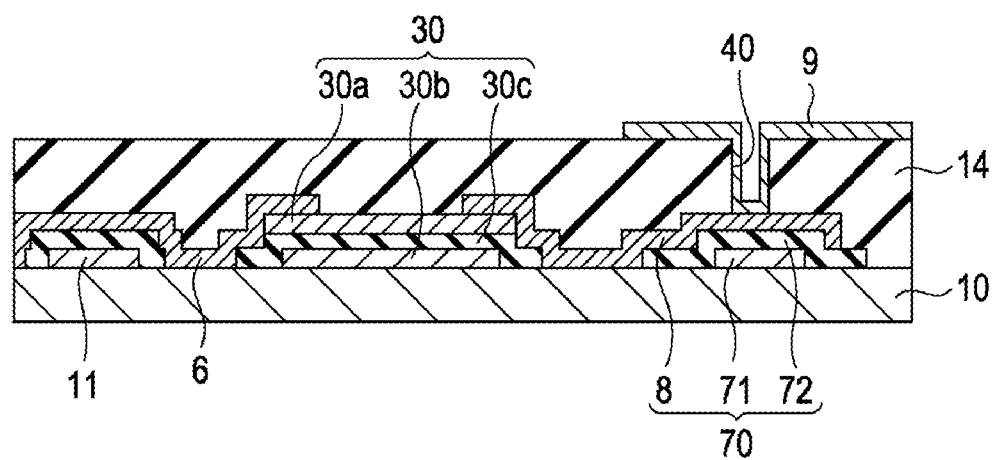
FIG. 6 is a cross-sectional diagram taken along the line VI-VI in FIG. 5.

FIG. 5 is an enlarged planar diagram of the pixel 60 of the image display region 10a of the electrophoretic display panel 1 of the embodiment. FIG. 6 is a cross-sectional diagram taken along the line VI-VI in FIG. 5. Here, in FIGS. 5 and 6, since the size of each layer and each member is set to an extent so that they can be recognized in the diagram, the scale for each layer and each member may differ.

The TFT 30 is formed on an element substrate 10. The TFT 30 is arranged for each of the pixels 60 (refer to FIG. 1). The TFT 30 is configured from a semiconductor layer 30a, a gate electrode 30b and a gate insulating film 30c. Here, the TFT 30 of the embodiment is laminated in the order of the gate electrode 30b, the gate insulating film 30c and the semiconductor layer 30a from the lower layer side, and is a so-called bottom gate type TFT. Here, the TFT 30 is an example of a "pixel transistor" of the invention.

The gate electrode 30b is formed to face the semiconductor layer 30a through the gate insulating film 30c. As shown in FIG. 5, the gate electrode 30b is formed as a portion of the scanning lines 11 formed on the element substrate 10. In the embodiment, among the scanning lines 11 formed mainly along the X direction, in one region overlapping with the semiconductor layer 30a when seen from a planar view above the element substrate 10, the portion of the scanning lines 11 formed to partially protrude in the Y direction functions as the gate electrode 30b. The gate insulating film 30c is provided on the upper layer side of the gate electrode 30b. The gate insulating film 30c is selectively provided only in a region within a specific range of the region where the TFT 30 is formed and the vicinity thereof.

From a planar view above the element substrate 10, the region of the semiconductor layer 30a which overlaps with the gate electrode 30b functions as a channel region. On the other hand, the region excluding the region which functions as the channel region functions as a source region and as a drain region, and each are electrically connected to the data lines 6 and the relay layer 8.

Also, the scanning lines 11 are formed on the element substrate 10. At the intersection of the scanning lines 11 and the data lines 6, the gate insulating film 30c is selectively formed on the upper layer side of the scanning lines 11, and on the upper layer side thereof, the data lines 6 are formed. That is, the gate insulating film 30c functions to electrically insulate both the data lines 6 and the scanning lines 11 on the element substrate 10.

One terminal of the relay layer 8 is electrically connected to the semiconductor layer 30a and the other terminal of the relay layer 8 is electrically connected to the pixel electrode 9 via a contact hole 40 provided in an interlayer insulating film 14 laminated on the upper layer side of the relay layer 8. That is, the relay layer 8 is an electrical relay connection between the semiconductor layer 30a and the pixel electrode 9. By outputting the image signals from the semiconductor layer 30a at a timing (that is, a timing when the TFT 30 is in an on state) when the scanning signals are supplied to the gate electrode 30b, a laminate structure is formed so that the image signals are applied to the pixel electrode 9 via the relay layer 8. Here, the pixel electrode 9 is an example of the "pixel electrode" of the invention. In the region where the contact hole 40 is formed, neither the gate insulating film 30c nor the interlayer insulating film 14 are formed.

Also, the relay layer 8 forms the holding capacitor 70 with the capacitance electrode 71 formed on the lower layer side through a capacitance insulating film 72. The capacitance electrode 71 holds a specific potential based on a potential supplied from the voltage source circuit (not shown). Due to this, the holding characteristics of the TFT 30 can be effectively improved.

Figure 7:
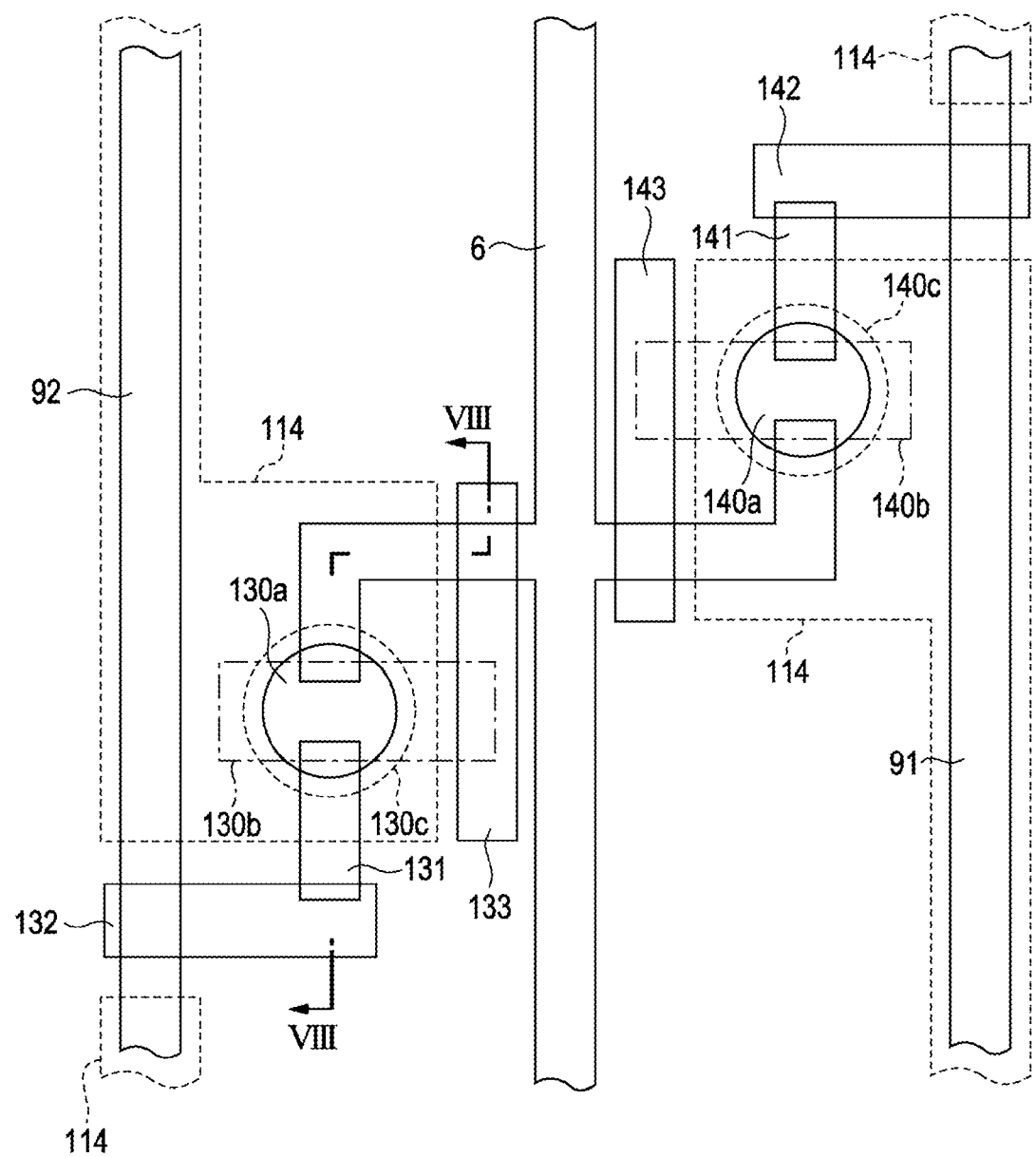
FIG. 7 is an enlarged planar diagram of the static electricity protection circuit of the electrophoretic display panel according to the first embodiment.
Figure 8:
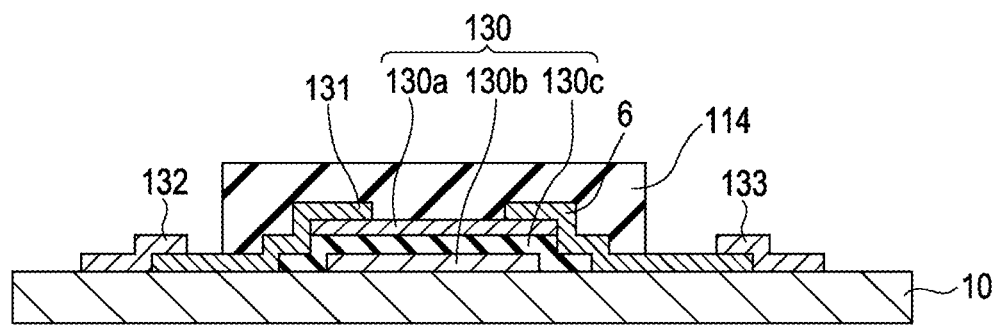
FIG. 8 is a cross-sectional diagram taken along the line VIII-VIII in FIG. 7.

Next, the specific configuration of the static electricity protection circuit 80 in the peripheral region of the electrophoretic display panel 1 of the embodiment will be described with reference to FIGS. 7 and 8. FIG. 7 is an enlarged planar diagram of the static electricity protection circuit 80 of the electrophoretic display panel 1 of the embodiment. FIG. 8 is a cross-sectional diagram taken along the line VIII-VIII in FIG. 7. Here, in FIGS. 7 and 8, since the size of each layer and each member is set to an extent so that they can be recognized in the diagram, the scale for each layer and each member may differ.

The first transistor 130 is configured by a gate electrode 130b being arranged to face a semiconductor layer 130a through a gate insulating film 130c. The source of the first transistor 130 is electrically connected to a first connection line 131. The first connection line 131 is further relayed with a second connection line 132 and electrically connected to the low potential voltage source line 92. On the other hand, the gate and the drain of the first transistor 130 are both electrically connected to the data lines 6. In particular, the gate is electrically connected to the data lines 6 via a third connection line 133. Here, the second and third connection lines are examples of the "connection wire" of the invention.

The second transistor 140 is configured by a gate electrode 140b being arranged to face a semiconductor layer 140a through a gate insulating film 140c. The source of the second transistor 140 is electrically connected to a fourth connection line 141. The fourth connection line 141 is further relayed with a fifth connection line 142 and electrically connected to the high potential voltage source line 91. On the other hand, the gate and the drain of the second transistor 140 are both electrically connected to the data lines 6. In particular, the gate is electrically connected to the data lines 6 via a sixth connection line 143. Here, the fifth and sixth connection lines are examples of the "connection wire" of the invention.

As shown in FIG. 8, the first transistor 130 is formed on the element substrate 10 via a base film 12. The first transistor 130 is configured by being provided with the gate electrode 130b, the gate insulating film 130c and the semiconductor layer 130a in that order from the lower layer side, and has a so-called bottom gate type structure. The source of the first transistor 130 is electrically connected to the first connection line 131, and the drain of the first transistor 130 is electrically connected to the data lines 6.

On the first transistor 130, an interlayer insulating film 114 is formed. When seen from a planar view above the element substrate 10, the interlayer insulating film 114 is formed so that the end portions of both of the first connection line 131 and the data lines 6 do not overlap with the interlayer insulating film 114. That is, when seen from a planar view from above the element substrate 10, the interlayer insulating film 114 is formed so that the edge portions of each of the first connection line 131 and the data lines 6 are partially exposed from the interlayer insulating film 114. Specifically, as shown in FIG. 7, the interlayer insulating film 114 is formed only in the region surrounded by the dotted line 114'. Thus, the second connection line 132 and the third connection line 133 are formed on the portion exposed from the interlayer insulating film 114 (that is, the end portions of the first connection line 131 and the data lines 6). As a result, since the second connection line 132 is in direct contact with the first connection line 131, the electrical connection between the first connection line 131 and the second connection line 132 can be realized without going via a contact hole. Also, since the third connection line 133 is in direct contact with the data lines 6, the electrical connection between the third connection line 133 and the data lines 6 can be realized without going via a contact hole.

Here, mainly the cross-sectional structure in the vicinity of the first transistor 130 has been described. However, since the cross-sectional structure of the vicinity of the second transistor 140 is the same, the diagrams and description have not been repeated here.

Figure 9:
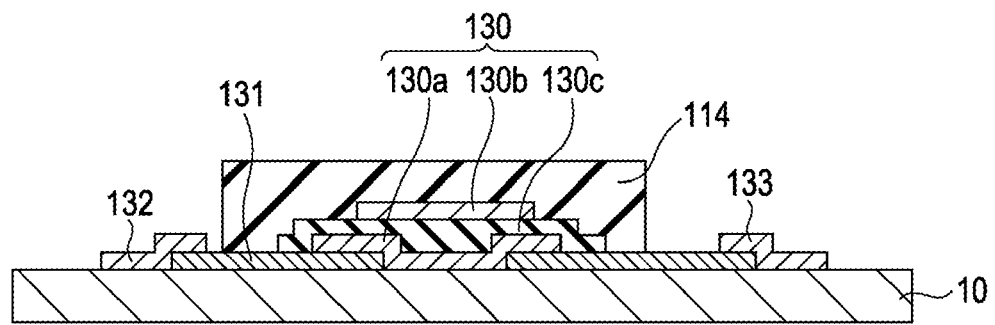
FIG. 9 is a cross-sectional diagram of a case where a first transistor of the electrophoretic display panel according to the first embodiment has a top gate structure.

Here, in the embodiment, the case where the first transistor 130 formed in the peripheral region has a bottom gate structure has been described. However, as shown in FIG. 9, the first transistor 130 may have a top gate structure. FIG. 9 is a cross-sectional diagram of the case where the first transistor 130 of the electrophoretic display panel 1 of the embodiment has a top gate structure. In this case, since the planar structure is the same as that described above, a detail description is not included.

Here, in the description above, the term "connection line" was used. However, the connection lines formed simultaneously with the pixel electrode are the second, third, fifth, and sixth connection lines 132, 133, 142 and 143. The first and fourth connection lines 131 and 141 are formed simultaneously with the data lines 6.

Second Embodiment

Next, with reference to FIGS. 10 and 11, the electrophoretic display panel of the second embodiment will be described. In the first embodiment described above, the case where the static electricity protection circuit 80 with a transistor which is diode-connected is provided in the peripheral region is exemplified. However, the present embodiment is different in that the electrophoretic display panel has an inverter circuit in the peripheral region. Here, since the other elements such as the configuration of the image display region 10a are the same as the first embodiment, a detailed description is not repeated here.

First, with reference to FIG. 10, the electrical configuration of an inverter circuit 210 provided in the peripheral region of the electrophoretic display panel of the embodiment will be described. FIG. 10 is a circuit diagram illustrating the electrical configuration of the inverter circuit 210 provided in the peripheral region of the electrophoretic display panel of the embodiment. Here, in FIG. 10, a condition, where a plurality of the same inverter circuits is connected, is diagrammatically shown, but below, only one inverter circuit 210 will be described as a representative and description of the other inverter circuits will not be included.

Figure 10:
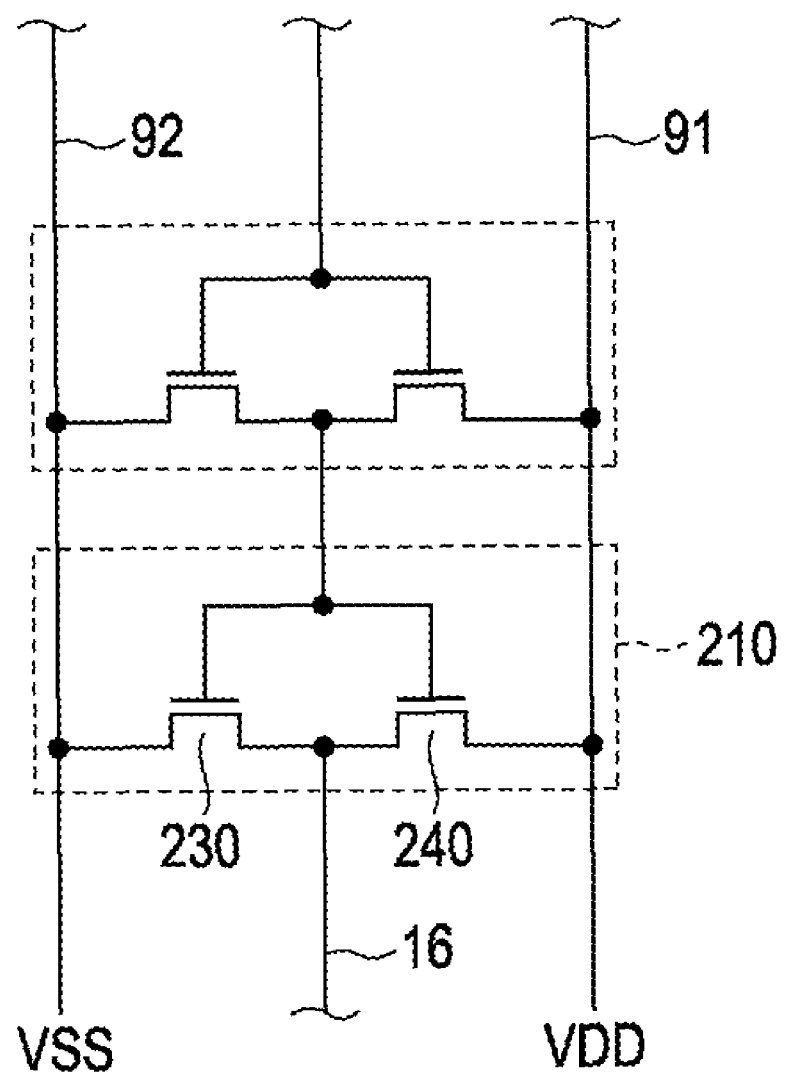
FIG. 10 is a circuit diagram illustrating an electrical configuration of an inverter circuit provided in a peripheral region of an electrophoretic display panel according to a second embodiment.

In FIG. 10, the circuit surrounded by the dotted line is one inverter circuit 210. The inverter circuit 210 is configured by a first transistor 230 and a second transistor 240.

The first transistor 230 is an N channel type transistor, and the second transistor 240 is a P channel type transistor.

The source of the first transistor 230 is electrically connected to the low potential voltage source line 92. On the other hand, the source of the second transistor 240 is electrically connected to the high potential voltage source line 91. The gate and the drain of the first transistor 230 are electrically short-circuited to the gate and the drain of the second transistor 240 and are electrically connected to an output line 16.

Next, the detailed configuration of an inverter circuit 210 of the electrophoretic display panel of the embodiment will be described with reference to FIG. 11. FIG. 11 is an enlarged planar diagram of the inverter circuit 210 of the electrophoretic display panel of the embodiment. Here, in FIG. 11, since the size of each layer and each member is set to an extent so that they can be recognized in the diagram, the scale for each layer and each member may differ.

The first transistor 230 is configured by a gate electrode 230b being arranged to face a semiconductor layer 230a through a gate insulating film 230c. The second transistor 240 is configured by a gate electrode 240b being arranged to face a semiconductor layer 240a through a gate insulating film 240c.

The source of the first transistor 230 is electrically connected to a first connection line 231. The first connection line 231 is further relayed with a second connection line 232 and electrically connected to the low potential voltage source line 92. The drain of the first transistor 230 is electrically short-circuited to the drain of the second transistor 240 via a third connection line 233. The gate of the first transistor 230 is electrically short-circuited to the gate of the second transistor 240 via a fourth connection line 234 and is electrically connected to the output line 16. The source of the second transistor 240 is electrically connected to a fifth connection line 235. The fifth connection line 235 is further relayed with a sixth connection line 236 and electrically connected to the high potential voltage source line 91. Here, the second, fourth, and sixth connection lines are examples of the "connection wire" of the invention. The other connection lines are formed simultaneously with the data lines 6.

Figure 11:
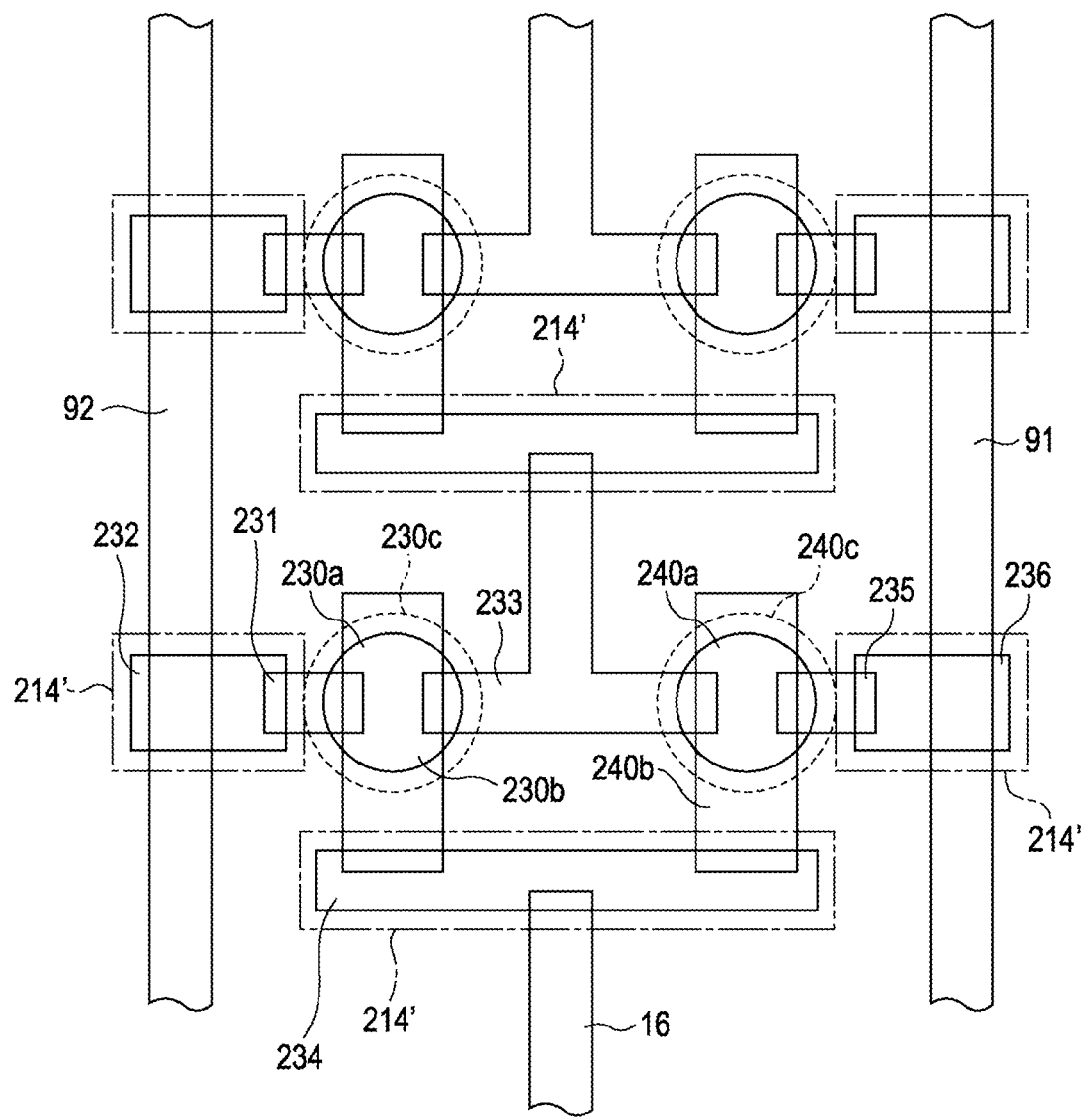
FIG. 11 is an enlarged planar diagram of the inverter circuit of the electrophoretic display panel according to the second embodiment.

From a planar view above the element substrate 10, the second connection line 232, the fourth connection line 234 and the sixth connection line 236 are arranged in a region where an interlayer insulating region 214 is not formed (in FIG. 11, a region 214' surrounded by a chain line). That is, the interlayer insulating film 214 is formed by wide application in a region excluding the region surrounded by the chain line 214'. Accordingly, in the region where the second connection line 232, the fourth connection line 234 and the sixth connection line 236 are formed, since the connection targets are exposed from the interlayer insulating film 214, the second connection line 232, the fourth connection line 234 and the sixth connection line 236 are formed so as to be electrically connected to the connection targets. That is, since the second connection line 232, the fourth connection line 234 and the sixth connection line 236 come into direct contact with the connection targets, electrical connection can be realized without going via a contact hole.

Manufacturing Method

Next, the manufacturing method of the electrophoretic display panel 1 of the first embodiment will be described with reference to FIGS. 12A to 12D.

FIGS. 12A to 12D are process cross-sectional diagrams illustrating a series of manufacturing processes for manufacturing the electrophoretic display panel 1 of the embodiment. Here, in FIGS. 12A to 12D, in order that the corresponding relationship of the cross-sectional diagram of the image display region 10a (refer to FIG. 6) and the cross-sectional diagram of the peripheral region (refer to FIG. 8) is shown to be easily understood, the scales of each diagram have been combined and shown.

Figure 12:
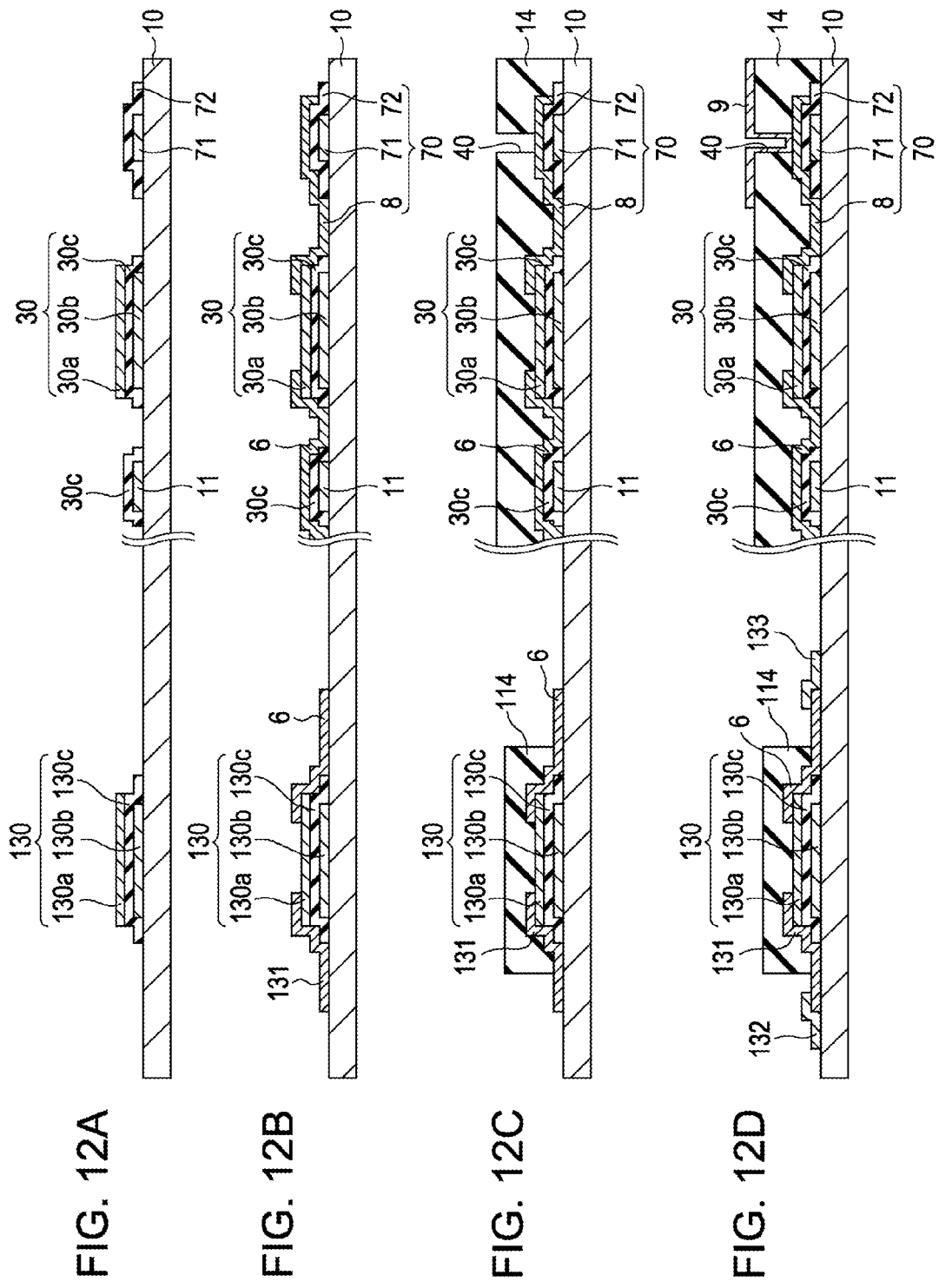
FIGS. 12A to 12D are process cross-sectional diagrams illustrating a series of manufacturing processes for manufacturing the electrophoretic display panel according to the first embodiment.

First, as shown in FIG. 12A, the element substrate 10 is prepared with, for example, a PET (polyethylene terephthalate) substrate with a thickness of 0.5 mm as a base substrate. Next, the gate electrodes 130b and 30b and the capacitance electrode 71 are formed from a silver paste with a thickness of 500 nm using an ink jet method. Next, the gate insulating films 130c and 30c are formed from polyimide with a thickness of 500 nm using an ink jet method. Then, the capacitance insulating film 72 is formed from acrylic with a thickness of 250 nm using an ink jet method. After that, the semiconductor layers 130a and 30a are formed from pentacene with a thickness of 50 nm using an ink jet method. The gate insulating films 130c and 30c and the capacitance insulating film 72 are formed selectively only in the region where necessary. In the holding capacitor 70 of the image display region 10a, the capacitance insulating film 72 is formed on the capacitance electrode 71. In the image display region 10a and the peripheral region of the TFT, a laminated layer of the gate electrode, the gate insulating film and the semiconductor layer is formed.

Next, as shown in FIG. 12B, the data lines 6, the relay layer 8 and the first connection line 131 are formed from a silver paste with a thickness of 300 nm using an ink jet method. In the image display region 10a, the data lines 6 and the relay layer 8 are formed so as to be electrically connected to the source and the drain of the semiconductor layer 30a. Here, the relay layer 8 is formed so that the holding capacitor 70 is formed by covering the capacitance insulating film 72. On the other hand, in the peripheral region, each of the second connection line 132 and the data lines 6 are formed so as to be electrically connected to the source and the drain of the semiconductor layer 130a. In the embodiment, in particular, it is good if the data lines 6, the relay layer 8 and the first connection line 131 are formed from the same layer. In this case, since these various lines can be formed simultaneously in the same process, a reduction in manufacturing processes and lower costs can be achieved.

Next, as shown in FIG. 12C, the interlayer insulating film 114 is formed from acrylic with a thickness of 700 nm using a screen printing method. This layer is formed selectively in the region where required and not over the entire surface of the substrate. The interlayer insulating film 114 is not formed in the region where the contact hole 40 is formed in the image display region 10a.

On the other hand, in the peripheral region, the interlayer insulating film 114 is formed on the first transistor 130. Here, when seen from a planar view above the element substrate 10, the interlayer insulating film 114 is formed so that the end portions of both of the first connection line 131 and the data lines 6 do not overlap with the interlayer insulating film 114. That is, the interlayer insulating film 114 is formed so that the edge portions of each of the first connection line 131 and the data lines 6 are partially exposed from the interlayer insulating film 114.

Next, as shown in FIG. 12D, the pixel electrode 9, the second connection line 132 and the third connection line 133 are formed from a copper paste with a thickness of 100 nm using an ink jet method.

By forming the pixel electrode 9 in the image display region 10a so as to fill in the contact hole 40 opened in the interlayer insulating film 114, the pixel electrode 9 is electrically connected to the relay layer 8 which is partially exposed at the bottom of the contact hole 40.

On the other hand, in the peripheral region, the second connection line 132 and the third connection line 133 are formed so as to come into direct contact with the end portions of the first connection line 131 and the data lines 6 which are partially exposed from the interlayer insulating film 114. In this manner, by forming the second connection line 132 and the third connection line 133 by film deposition on the first connection line 131 and the data lines 6 which are connection targets in a state of being exposed in this manner when viewed from the interlayer insulating film 114, an electrical connection can be realized.

In the embodiment, in particular, the pixel electrode 9 of the image display region 10a and the second connection line 132 and the third connection line 133 of the peripheral region are formed from the same film. In this case, since the pixel electrode 9, the second connection line 132 and the third connection line 133 can be simultaneously formed in the same process, a reduction in manufacturing processes and lower costs can be achieved.

Although not shown, the gate insulating film and the interlayer insulating film are not also provided at a mounting terminal connecting an external circuit formed in the same layer as the scanning lines 11, the data lines 6 and the like. Also, in the pixel electrode forming process, the mounting terminal may be formed of the same material as the pixel electrode and may be used as a material for performing mounting connection.

By attaching an opposing substrate where an electrophoresis material of a capsule type is held on a transmissive electrode formed from ITO with a thickness of 50 nm on the other substrate formed from a PET substrate with a thickness of 0.5 mm, a driving IC is mounted and the electro-optical device can be formed.

In the above manufacturing method, the pixel electrodes, the connection lines and the line material may use other pastes, organic or inorganic conductive materials or metals. The semiconductor layers may use other organic semiconductor materials or inorganic semiconductor materials. The insulating films may use other organic insulating films or inorganic insulating films. The substrates may use other organic materials or thin inorganic materials. The method for forming thin films may use other printing methods or application methods.

According to the manufacturing method described above, the electrophoretic display device configured as described above according to the embodiment can be manufactured.

Electronic Apparatus

Next, the electronic apparatus applied with the electrophoretic display device described above will be described with reference to FIGS. 13 and 14. Below, the cases where the electrophoretic display device described above is applied to an electronic paper and an electronic notebook are used as examples.

Figure 13:
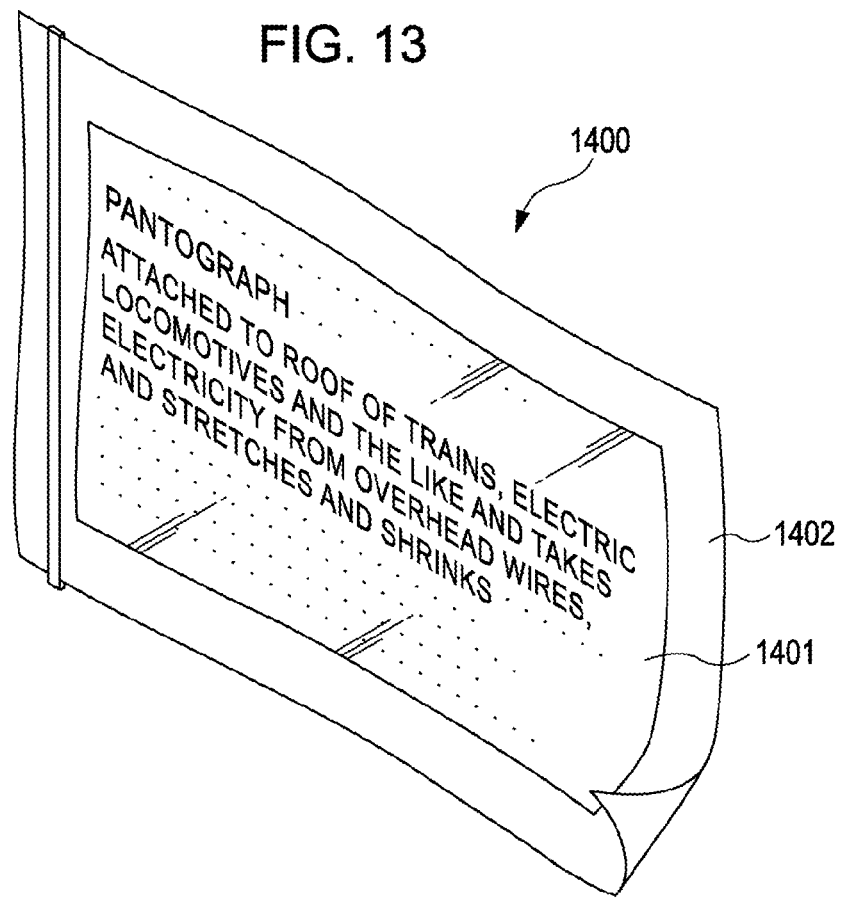
FIG. 13 is a perspective diagram illustrating a configuration of an electronic paper applied with the electrophoretic display panel of the invention.

FIG. 13 is a perspective diagram illustrating the configuration of an electronic paper 1400.

As shown in FIG. 13, the electronic paper 1400 is provided with the electrophoretic display device of the invention described above as a display unit 1401. The electronic paper 1400 has flexibility and is configured by being provided with a body 1402 formed of a rewritable sheet having the same feeling and flexibility of existing paper.

Figure 14:
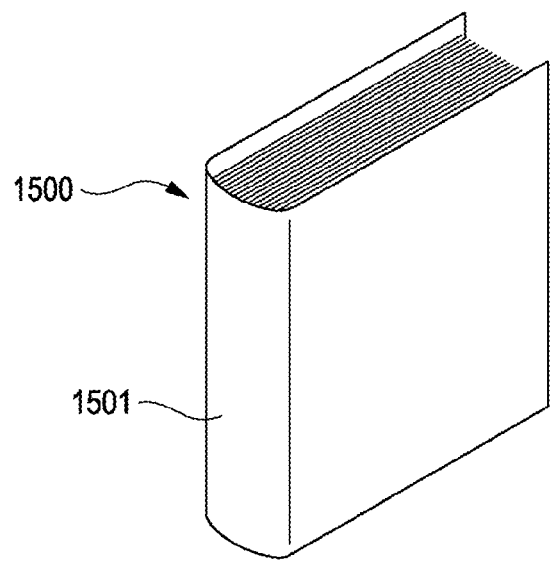
FIG. 14 is a perspective diagram illustrating a configuration of an electronic notebook applied with the electrophoretic display panel of the invention.

FIG. 14 is a perspective diagram illustrating the configuration of an electronic notebook 1500.

As shown in FIG. 14, the electronic notebook 1500 is a binding together of a plurality of sheets of the electronic paper 1400 shown in FIG. 13 which are sandwiched in a cover 1501. The cover 1501 is provided with a display data input unit (not shown) for inputting display data sent from, for example, an external device. Due to this, the display contents can be changed or updated according to this display data while the electronic paper remains in a bound state.

Since the electronic paper 1400 and the electronic notebook 1500 described above are provided with the electrophoretic display device of the embodiment described above, it is possible to perform a high-quality image display with low power consumption.

Here, other than these, the electrophoretic display device of the embodiment described above can be applied to the display units of electronic apparatuses such as watches, mobile phones, portable audio devices and the like.

Here, aside from the electrophoretic display panel described in the embodiment described above, the invention can also be applied to liquid crystal displays (LCD), plasma displays (PDP), field emission displays (FED, SED), organic EL displays, digital micromirror devices (DMD), and the like.

The invention is not limited to the embodiments described above, but may be appropriately modified in the scope of claims and the scope of the concept or the spirit of the invention can be understood from the entire specification. Of course, a substrate for electro-optical devices having such modifications, an electro-optical device having the substrate for electro-optical devices and an electronic apparatus having the electro-optical device are also included in the technical scope of the invention.

What is claimed is:

1. A substrate for electro-optical devices, which has a display region where a plurality of pixels is arranged, comprising:
    a substrate,
    a pixel electrode provided for each of the pixels on the substrate,
    a pixel transistor which is provided for each of the pixels on the substrate on a lower layer side than the pixel electrode, the pixel transistor including a gate electrode, a semiconductor layer, and a gate insulating film selectively provided in a specific region on the substrate between the gate electrode and the semiconductor layer such that the gate insulating film extends past a perimeter of the gate electrode in plan view and is surrounded by a region that does not include the gate insulating film in plan view, the pixel transistor being electrically connected to the pixel electrode,
    an interlayer insulating film arranged between the pixel electrode and the pixel transistor and selectively provided in a specific region on the substrate,
    a periphery transistor provided in a peripheral region positioned on the periphery of the display region on the substrate, and
    a connection wire formed in the same film as the pixel electrode in a region where the interlayer insulating film and the gate insulating film included in the pixel transistor and the periphery transistor are not formed in plan view, and electrically connected to the periphery transistor.

2. The substrate for electro-optical devices according to claim 1,
    wherein the gate insulating film and the interlayer insulating film each comprise an insulating material that has been selectively applied to a region where the gate insulating film and the interlayer insulating film are to be formed.

3. The substrate for electro-optical devices according to claim 1,
    wherein the pixel electrode and the connection wire each comprise a conductive material that has been selectively applied in a region where the pixel electrode and the connection wire are to be formed.

4. The substrate for electro-optical devices according to claim 1,
    wherein the connection wires are diode-connected with the periphery transistor.

5. The substrate for electro-optical devices according to claim 1, wherein
    a plurality of periphery transistors are connected to each other by the connection wire, and
    the plurality of periphery transistors configure an inverter circuit.

6. An electro-optical device comprising the substrate for electro-optical devices according to claim 1.

7. An electro-optical device comprising the substrate for electro-optical devices according to claim 2.

8. An electro-optical device comprising the substrate for electro-optical devices according to claim 3.

9. An electro-optical device comprising the substrate for electro-optical devices according to claim 4.

10. An electro-optical device comprising the substrate for electro-optical devices according to claim 5.

11. An electronic apparatus comprising the electro-optical device according to claim 6.

12. An electronic apparatus comprising the electro-optical device according to claim 7.

13. An electronic apparatus comprising the electro-optical device according to claim 8.

14. An electronic apparatus comprising the electro-optical device according to claim 9.

15. An electronic apparatus comprising the electro-optical device according to claim 10.

* * * * *